(12) United States Patent
Sato (10) Patent No.: US 9,921,469 B2
(45) Date of Patent: Mar. 20, 2018

(54) IMPRINT METHOD, IMPRINT APPARATUS, AND METHOD OF MANUFACTURING ARTICLE

(71) Applicant: CANON KABUSHIKI KAISHA, Tokyo (JP)

(72) Inventor: Hiroshi Sato, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 408 days.

(21) Appl. No.: 14/257,171

(22) Filed: Apr. 21, 2014

(65) Prior Publication Data

US 2014/0320842 A1 Oct. 30, 2014

(30) Foreign Application Priority Data

Apr. 24, 2013 (JP) .................................. 2013-091786
Feb. 20, 2014 (JP) .................................. 2014-030788

(51) Int. Cl.
*G03F 7/00* (2006.01)

(52) U.S. Cl.
CPC .................................. *G03F 7/0002* (2013.01)

(58) Field of Classification Search
CPC ... B29C 44/5627; B29C 59/02; B29C 33/424; B29C 2033/426; G03F 7/0002
See application file for complete search history.

(56) References Cited

U.S. PATENT DOCUMENTS

| 7,592,108 | B2 | 9/2009 | Yamaguchi et al. |
| 7,745,237 | B2 | 6/2010 | Katagiri et al. |
| 8,187,515 | B2 | 5/2012 | Sreeenivasan et al. |
| 8,215,946 | B2 | 7/2012 | Ganapathisubramanian et al. |
| 8,246,887 | B2 | 8/2012 | Seki et al. |
| 8,444,889 | B2 | 5/2013 | Tokue et al. |
| 8,703,035 | B2 | 4/2014 | Sato |

(Continued)

FOREIGN PATENT DOCUMENTS

| CN | 101009218 | 8/2007 |
| CN | 102203672 A | 9/2011 |

(Continued)

OTHER PUBLICATIONS

Office Action issued in Taiwanese Appln. No. 103112857 mailed Aug. 8, 2016. English translation provided.

(Continued)

*Primary Examiner* — Stella Yi
(74) *Attorney, Agent, or Firm* — Rossi, Kimms & McDowell LLP (57) ABSTRACT

The present invention provides an imprint method comprising a deformation step of deforming a pattern surface of a mold so that the mold is gradually brought into contact with the imprint material outward from a central portion of the pattern surface, an obtaining step of obtaining a shift amount indicating how much a mark on the mold shifts in a direction parallel to a substrate surface due to deformation of the pattern surface, a detection step of detecting the mark on the mold and a mark on the substrate while the pattern surface is deformed, and obtaining relative positions of the mold and the substrate from a detection result, and an alignment step of aligning the mold and the substrate using the shift amount and the relative positions while the pattern surface is deformed.

12 Claims, 5 Drawing Sheets

(56) References Cited

U.S. PATENT DOCUMENTS

| | | | |
|---|---|---|---|
| 9,280,047 B2 | 3/2016 | Tanaka et al. | |
| 2006/0152703 A1* | 7/2006 | Yamaguchi | G03F 1/22 355/77 |
| 2011/0141489 A1 | 6/2011 | Sato | |

FOREIGN PATENT DOCUMENTS

| | | |
|---|---|---|
| CN | 102765240 | 11/2012 |
| JP | 2006303292 | 11/2006 |
| JP | 4185941 B | 11/2008 |
| JP | 2009-536591 A | 10/2009 |
| JP | 2010-058316 A | 3/2010 |
| JP | 2011-127979 A | 6/2011 |
| JP | 2012099790 A | 5/2012 |
| JP | 2013-038191 A | 2/2013 |
| JP | 2013507770 A | 3/2013 |
| TW | 200950958 A1 | 12/2009 |
| TW | 201036801 A | 10/2010 |
| TW | 201141688 A1 | 12/2011 |
| TW | 201311425 A1 | 3/2013 |
| WO | 2004099879 A2 | 11/2004 |
| WO | 2007132320 A2 | 11/2007 |

OTHER PUBLICATIONS

Office Action issued in Chinese Appln. No. 201410166556.8 dated Mar. 15, 2017. English translation provided.

English translation of Office Action issued in Japanese Appln. No. 2014-030788 dated Dec. 4, 2017.

* cited by examiner

IMPRINT METHOD, IMPRINT APPARATUS, AND METHOD OF MANUFACTURING ARTICLE

BACKGROUND OF THE INVENTION

Field of the Invention

The present invention relates to an imprint method, an imprint apparatus, and a method of manufacturing an article.

Description of the Related Art

An imprint technique that transfers a pattern formed on a mold onto a substrate is attracting attention as one of lithography techniques. In an imprint apparatus using such imprint technique, a mold including a pattern surface on which a fine uneven pattern is formed is brought into contact with an imprint material (resin) supplied onto a substrate. When the mold and the resin are brought into contact with each other, if air bubbles remain in a concave portion of the pattern, loss of the pattern transferred onto the substrate may occur. To solve this problem, an imprint apparatus described in Japanese Patent Laid-Open No. 2009-536591 suppresses air bubbles remaining in a concave portion of a pattern by deforming a pattern surface into a convex shape to bend toward a substrate, and bringing a mold into contact with a resin.

On the other hand, an imprint apparatus is also required to accurately transfer the pattern of a mold to a shot region formed on a substrate. To achieve this, Japanese Patent No. 4185941 proposes an imprint apparatus using a die-by-die alignment method as an alignment method when transferring the pattern of a mold to a shot region. The die-by-die alignment method is an alignment method of optically detecting a mark formed in each shot region on a substrate and a mark formed on a mold, thereby correcting a relative positional shift between the substrate and the mold.

When the entire pattern formed on the mold comes into contact with the resin on the substrate, deformation of the pattern surface (convex shape) becomes small. If the mold and the substrate are aligned in this state, a shearing stress occurs, thereby making it difficult to change the relative positions of the mold and substrate. It takes considerable time to perform alignment. Therefore, before the entire pattern of the mold comes into contact with the resin, that is, while the pattern surface is deformed, it is desirable to align the mold and the substrate. However, while the pattern surface of the mold is deformed, the positions of marks formed on the mold change, as compared with those before deformation. It is thus difficult to accurately perform alignment.

SUMMARY OF THE INVENTION

The present invention provides a technique advantageous in accurately aligning a mold and a substrate.

According to one aspect of the present invention, there is provided an imprint method of transferring a pattern to an imprint material on a substrate by curing the imprint material while a mold having a pattern surface on which a mark are formed is in contact with the imprint material, the method comprising: a deformation step of deforming the pattern surface into a convex shape to bend toward the substrate by applying a first force to the mold so that the mold is gradually brought into contact with the imprint material outward from a central portion of the pattern surface; an obtaining step of obtaining a shift amount indicating how much the mark on the mold shifts in a direction parallel to a substrate surface due to deformation of the pattern surface; a detection step of detecting the mark on the mold and a mark on the substrate while the pattern surface is deformed, and obtaining relative position of the mold and the substrate from a detection result; and an alignment step of aligning the mold and the substrate using the shift amount and the relative position while the pattern surface is deformed, so that the mark on the mold and the mark on the substrate align each other when deformation of the pattern surface has become small and thus the shift amount has become also small. Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given.

First Embodiment

An imprint apparatus 100 according to the first embodiment of the present invention will be described with reference to FIG. 1. The imprint apparatus 100 cures an imprint material (resin) on a substrate while a mold having a fine uneven pattern formed on it is in contact with the resin, and performs imprint processing of transferring the pattern onto the substrate by a process of releasing the mold from the cured resin. The imprint apparatus 100 performs the above-described imprint processing by performing alignment (die-by-die alignment) with the mold for each shot region formed on the substrate.

Currently commercialized imprint apparatuses adopt a heat cycle method and a photo-curing method. In the heat cycle method, a thermoplastic resin is supplied (applied) as an imprint material on a substrate. Then, the thermoplastic resin is heated to a temperature equal to or higher than the glass-transition temperature, thereby increasing the fluidity of the resin. In this state, a mold is brought into contact with the resin formed on the substrate, and cooling is performed.

After that, a pattern can be formed on the substrate by releasing the mold from the resin. On the other hand, in the photo-curing method, an ultraviolet-curing resin is supplied as an imprint material on a substrate. Then, the ultraviolet-curing resin is irradiated with ultraviolet rays while a mold is in contact with the ultraviolet-curing resin formed on the substrate. After the resin is cured by the ultraviolet irradiation, a pattern can be formed on the substrate by releasing the mold from the resin. The photo-curing method of applying an ultraviolet-curing resin on the substrate, and irradiating the resin with ultraviolet rays is applied to the imprint apparatus 100 of the first embodiment.

Figure 1:
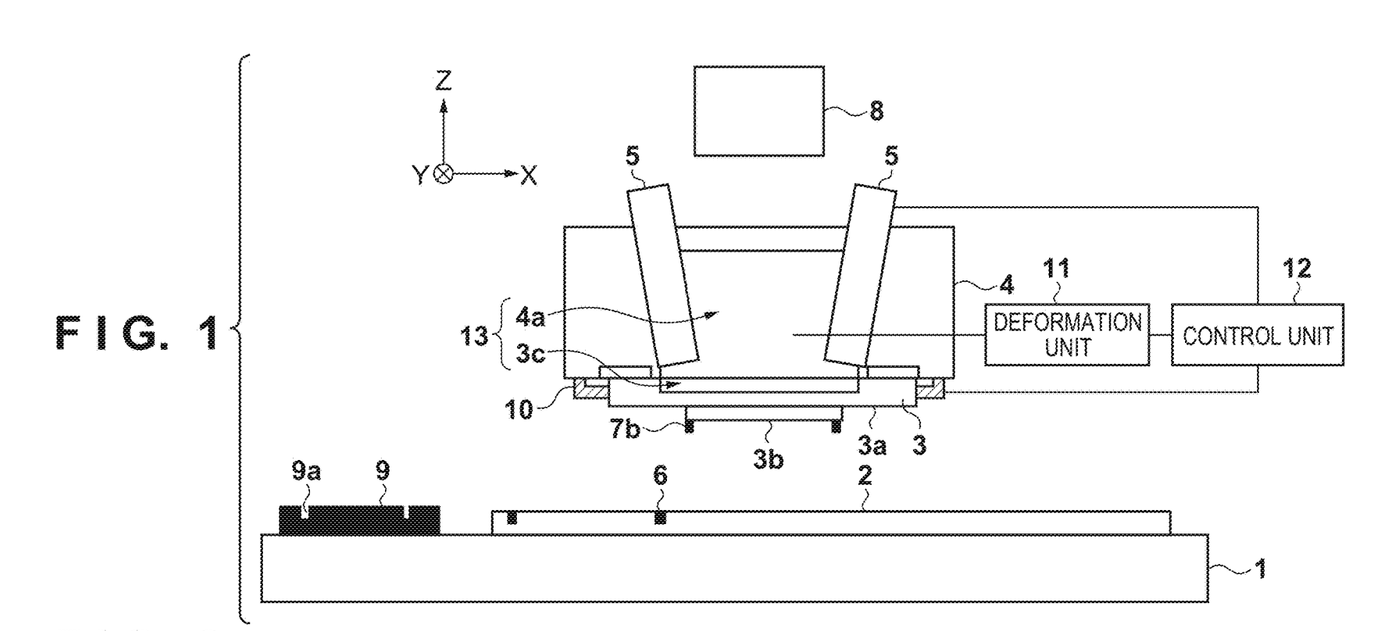
FIG. 1 is a view showing an imprint apparatus 100 according to the first embodiment.

FIG. 1 is a schematic view showing the imprint apparatus 100 of the first embodiment. The imprint apparatus 100 of the first embodiment includes an imprint head 4 for holding a mold 3, a substrate stage 1 for holding a substrate 2, and a light source 8 for emitting ultraviolet rays which cure an ultraviolet-curing resin (to be referred to as a resin hereinafter) supplied on the substrate. The imprint apparatus 100 also includes an actuator 10 for applying a force (second force) to a side surface of the mold, a plurality of detection units 5 (scopes) for detecting marks 7 on the mold and marks 6 on the substrate, a deformation unit 11 for deforming the mold 3, and a control unit 12. The control unit 12 includes a CPU and a memory, and controls the overall imprint apparatus 100 (the respective units of the imprint apparatus 100). That is, the control unit 12 controls alignment between the mold 3 and the substrate 2, and controls imprint processing of the imprint apparatus 100.

The mold 3 is generally made of a material such as quartz capable of transmitting ultraviolet rays. A pattern portion 3b including an uneven pattern 7a to be transferred to the resin on the substrate and marks 7b used for alignment with the substrate 2 is formed on part of the substrate-side surface (a pattern surface 3a) of the mold 3. A surface on the opposite side of the pattern surface of the mold 3 is recessed to reduce the thickness of a portion around the pattern portion 3b, thereby forming a concave portion 3c. Decreasing the thickness of the portion around the pattern portion 3b allows the mold 3 (pattern surface 3a) to be easily deformed when a pressure is applied to an air chamber 13 (to be described later). As the substrate 2, for example, a single-crystal silicon substrate or the like is used. A resin is applied on the upper surface (processed surface) of the substrate 2, and the mold and the resin applied on the substrate 2 are in contact with each other. It is possible to transfer the pattern of the mold 3 to the resin by irradiating the resin with ultraviolet rays to cure it while the resin and the mold 3 (pattern portion 3b) are in contact with each other, and releasing the mold 3 from the cured resin.

The imprint head 4 holds the mold 3 by, for example, a vacuum suction force or an electrostatic force. A concave portion 4a is formed in a surface of the imprint head 4, which is in contact with the mold 3, and is covered by the mold 3 to serve as an almost sealed space. A space defined by the concave portion 4a of the imprint head 4 and the concave portion 3c of the mold 3 will be referred to as the air chamber 13 hereinafter. The air chamber 13 is connected to the deformation unit 11 through a pipe. The deformation unit 11 includes a pressure regulator such as a servo valve, and a selector valve for switching between a supply source which supplies compressed air to the air chamber 13 and a vacuum source which evacuates the air chamber 13 to a vacuum. The pressure of the air chamber 13 may be measured by arranging a pressure sensor in the supply source, along a path, within the air chamber 13, or the like. The pressure applied by the supply source alone may be measured.

Figure 2:
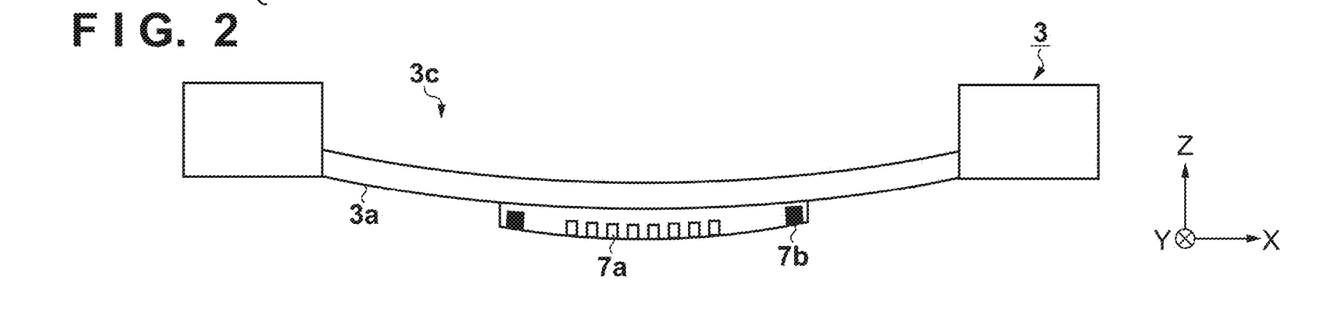
FIG. 2 is a sectional view showing a mold while a pattern surface is deformed into a convex shape to bend toward a substrate.

The deformation unit 11 controls the pressure of the air chamber 13 to increase when imprint processing is performed, for example, when the mold 3 is brought into contact with (is pressed against) the resin on the substrate. This makes it possible to deform the mold 3 by applying a force (first force) to the mold 3 so that the pattern surface 3a is deformed into a convex shape to bend toward the substrate 2, as shown in FIG. 2. FIG. 2 is a sectional view showing the mold 3 when the pattern surface 3a is deformed into a convex shape to bend toward the substrate 2. When the mold 3 is deformed in this way, and brought into contact with the resin on the substrate, the pattern on the pattern surface 3a of the mold 3 comes into contact with the resin outward from the central portion of the pattern surface 3a. This can suppress air bubbles trapped in the pattern 7a of the mold 3. As a result, it is possible to prevent loss of the pattern transferred onto the substrate. Note that as the mold 3 gradually comes into contact with the resin on the substrate outward from the central portion of the pattern surface 3a, the deformation unit 11 gradually decreases the pressure of the air chamber 13. That is, as the pattern surface 3a gradually comes into contact with the resin on the substrate, the force applied to the mold 3 is gradually weakened. With this processing, deformation of the pattern surface 3a becomes small when the whole pattern portion 3b (the entire pattern of the mold 3) comes into contact with the resin on the substrate, and thus the pattern surface 3a can be almost flat. On the other hand, to release the mold 3 from the cured resin, the deformation unit 11 gradually increases the pressure of the air chamber 13. This allows the pattern surface 3a of the mold 3 to be gradually released from the resin from an edge of the pattern surface 3a toward its central portion, thereby preventing loss of the pattern transferred onto the substrate.

The plurality of detection units 5 are arranged in the concave portion 4a of the imprint head 4, and tilted to prevent ultraviolet rays for curing the resin from being blocked. Each detection unit 5 detects the mark 6 formed in the shot region on the substrate (to be referred to as the mark 6 on the substrate hereinafter), and the mark 7b formed on the mold 3 (to be referred to as the mark 7b on the mold hereinafter). The control unit 12 obtains the relative positions of the mold 3 and substrate 2 using detection results from the respective detection units 5, and performs alignment by moving the substrate stage 1 or the imprint head 4 so that the marks 7b on the mold and the marks 6 on the substrate overlap each other. At this time, a shape difference may occur between the pattern portion 3b of the mold 3 and the shot region on the substrate, and thus the marks 7b on the mold and the marks 6 on the substrate may not overlap each other. In this case, the control unit 12 applies a force to a side surface of the mold 3 using the actuator 10 such as a piezoelectric element, thereby changing the shape difference of the pattern surface 3a (pattern portion 3b) of the mold 3 so that the pattern portion 3b of the mold 3 overlaps the shot region. Consequently, imprint processing can be performed by accurately overlaying the pattern portion 3b of the mold 3 on the shot region on the substrate. The shape difference between the pattern portion 3b of the mold 3 and the shot region on the substrate includes a magnification, distortion, a trapezoid, and a parallelogram.

Figure 3:
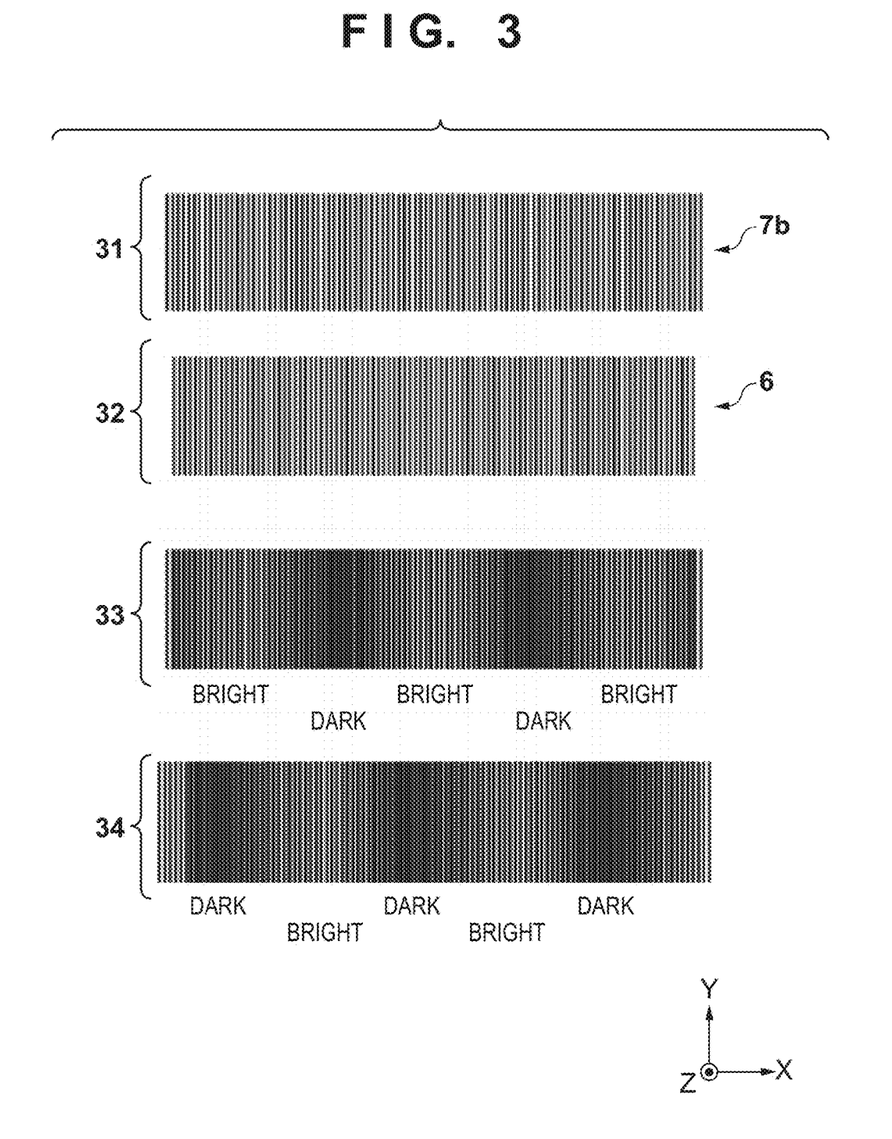
FIG. 3 is a view showing marks on the mold and those on the substrate.
Figure 4:
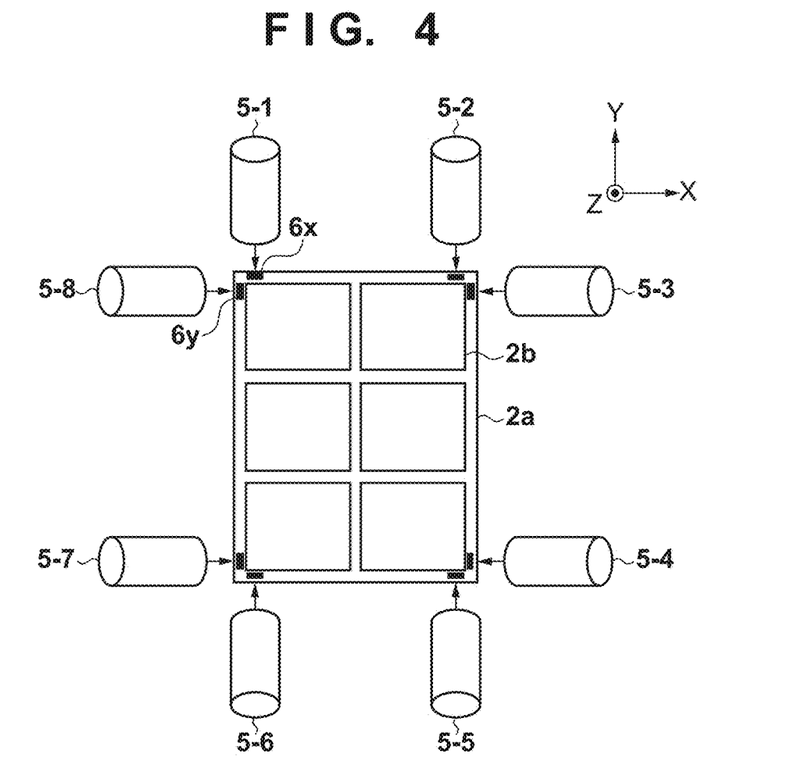
FIG. 4 is a view showing the positional relationship between the marks on the substrate and a plurality of detection units when viewed from the Z direction.

A method of detecting the marks 7b on the mold and the marks 6 on the substrate using the detection units 5, and obtaining the relative positions will be explained with reference to FIGS. 3 and 4. The mark 7b on the mold and the mark 6 on the substrate will be described first with reference to FIG. 3. Referring to FIG. 3, reference numeral 31 denotes the mark 7b on the mold; 32, the mark 6 on the substrate; and 33 and 34, results of overlaying the mark 7b on the mold and the mark 6 on the substrate. As indicated by 31 and 32 in FIG. 3, the mark 7b on the mold and the mark 6 on the substrate form grating patterns having different pitches. When the mark 7b on the mold and the mark 6 on the substrate are overlaid, therefore, a moire pattern in which a bright portion and a dark portion are alternately arrayed in accordance with the pitch difference can be produced as indicated by 33 in FIG. 3. The positions of the bright portions and dark portions of the moire pattern change according to a change in the relative positions of the two grating patterns (the mark 7b on the mold and the mark 6 on the substrate). If, for example, the mark 7b on the mold and the mark 6 on the substrate are relatively shifted in the X direction, the moire pattern indicated by 33 in FIG. 3 changes into the moire pattern indicated by 34 in FIG. 3. The change in moire pattern enlarges and projects the relative positional difference between the mark 7b on the mold and the mark 6 on the substrate. Accordingly, the detection unit 5 can accurately detect the relative positions of the mark 7b on the mold and the mark 6 on the substrate. In the first embodiment, the detection unit 5 detects the relative positions of the mark 7b on the mold and the mark 6 on the substrate using the moire pattern produced by overlaying the marks 7b and 6. The present invention, however, is not limited to this. For example, it is only necessary to detect the mark 7b on the mold and the mark 6 on the substrate by the detection unit 5 using, for example, a Box in Box mark.

The arrangement of the plurality of detection units 5 will be described next with reference to FIG. 4. FIG. 4 is a view showing the positional relationship between the marks 6 on the substrate and the plurality of detection units 5 when viewed from the Z direction. A shot region 2a on the substrate includes a plurality of chip regions 2b (six chip regions in FIG. 4). X-direction detection marks 6x and Y-direction detection marks 6y are formed in the four corners of the shot region 2a. The X-direction detection mark 6x is the mark 6 in which a grating pattern is arrayed in the X direction, as indicated by 31 in FIG. 3. The Y-direction detection mark 6y is a mark in which a grating pattern is arrayed in the Y direction as if the mark 6 indicated by 31 in FIG. 3 were rotated through 90°. The mark 7b on the mold is formed by the grating pattern having a pitch different from that of the grating pattern of the mark 6 on the substrate, as described using 32 in FIG. 3, and is arranged at a position on the mold corresponding to the position of the mark 6 on the substrate. The plurality of detection units 5 are arranged so that each detection unit observes (detects) one of the marks 6 (6x or 6y) on the substrate (shot region) through the mark 7b on the mold corresponding to the mark 6. Based on the detection result of each detection unit 5, it is possible to obtain the relative positions of the mark 6 on the substrate and the mark 7b on the mold. For example, each of detection units 5-1, 5-2, 5-5, and 5-6 detects the X-direction detection mark 6x on the substrate, and the mark 7b on the mold corresponding to that mark 6x. Each of detection units 5-3, 5-4, 5-7, and 5-8 detects the Y-direction detection mark 6y on the substrate, and the mark 7b on the mold corresponding to that mark 6y.

As described above, it is possible to detect the marks 7b on the mold and the marks 6 formed in the four corners of the shot region 2a using the plurality of detection units 5, thereby obtaining the relative positions of the shot region 2a and the pattern portion 3b of the mold 3 based on detection results. Based on the relative positions detected by the plurality of detection units 5, the control unit 12 controls alignment so that the shot region 2a and the pattern portion 3b of the mold 3 overlap each other. It is also possible to detect the relative shape difference (a magnification, deformation into a trapezoid or parallelogram, a twist, or the like) between the shot region 2a and the pattern portion 3b of the mold 3 based on the detection results of the plurality of detection units 5. If, for example, the plurality of detection units 5 have detected that the marks 7b on the mold shift outward from the marks 6 on the substrate by the same amount, it indicates that a magnification difference has occurred between the shot region 2a and the pattern portion 3b of the mold 3. If such magnification difference has occurred, it is possible to overlay the marks 7b on the mold on the marks 6 on the substrate by applying a force to a side surface of the mold 3 by the actuator 10.

Assume that the imprint apparatus 100 having the above-described arrangement aligns the shot region 2a and the pattern portion 3b of the mold 3 while the whole pattern portion 3b is in contact with the resin on the substrate. In this case, since the contact area between the pattern surface 3a of the mold 3 and the resin on the substrate is large, a shearing stress between them is also large. Especially, in imprint processing, in addition to the large contact area, the thickness of the resin is small on the order of nm, and thus the shearing stress further increases. That is, while the whole pattern portion 3b is in contact with the resin on the substrate, it is difficult to change the relative positions of the mold 3 and substrate 2 due to the shearing stress between the pattern surface 3a and the resin on the substrate. It takes considerable time to align the mold 3 and the substrate 2. As a result, the time taken to align the mold 3 and the substrate 2 is longer than the time taken to complete filling of the resin in the pattern 7a of the mold 3, thereby decreasing the throughput of the imprint apparatus. It is, therefore, desirable that the imprint apparatus 100 aligns the mold 3 and the substrate 2 even while the mold 3 and the substrate 2 are close to each other, that is, while the pattern surface 3a is deformed into a convex shape to bend toward the substrate 2.

Figure 5:
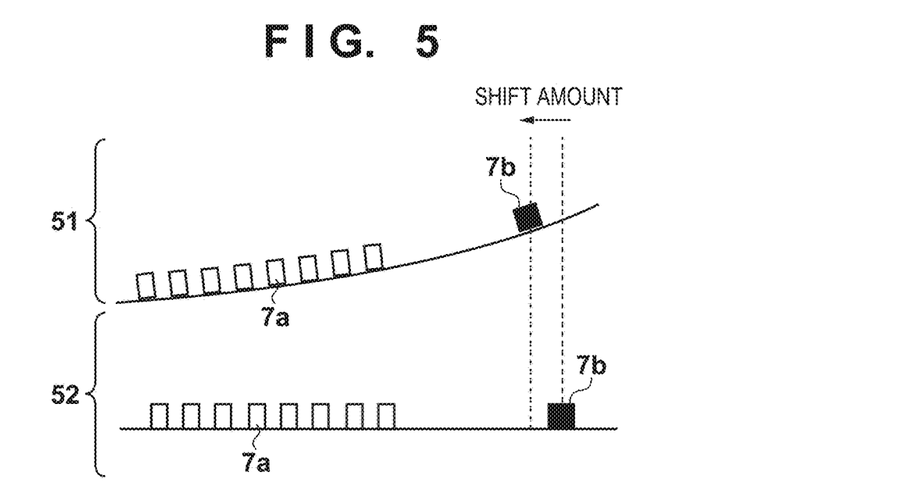
FIG. 5 is a view showing the sectional shape of the pattern surface of the mold before and after the mold comes into contact with a resin on the substrate.

While the mold 3 is deformed, however, the positions of the marks 7b on the mold shift in a direction parallel to the substrate surface (X-Y plane) in accordance with the deformation. Therefore, it is difficult to accurately align the mold 3 and the substrate 2. For example, FIG. 5 shows the sectional shape of the pattern surface 3a (pattern portion 3b) of the mold 3 before and after the mold 3 comes into contact with the resin on the substrate. Referring to FIG. 5, reference numeral 51 denotes the sectional shape of the pattern surface 3a before the mold 3 comes into contact with the resin on the substrate, that is, while the pattern surface 3a is deformed into a convex shape to bend toward the substrate 2; and 52, the sectional shape of the pattern surface 3a while the whole pattern portion 3b of the mold 3 is in contact with the resin on the substrate, that is, while deformation of the pattern surface 3a is small (the pattern surface 3a is almost flat). As is apparent from FIG. 5, while the pattern surface 3a is deformed (51 in FIG. 5), the mark 7b on the mold shifts in a direction (−X direction) parallel to the substrate surface, as compared with the state in which the pattern surface 3a is almost flat (52 in FIG. 5). If the pattern surface of the mold 3 is parallel to the substrate surface (a surface on which the mark is formed), the mark does not shift. The position of the mark on the mold and that of the mark on the substrate, which are detected while the pattern surface of the mold is parallel to the substrate surface, are different from those detected while the surfaces are not parallel to each other. To solve this problem, the imprint apparatus 100 of the first embodiment includes an obtaining unit for obtaining a shift amount indicating how much the mark 7b on the mold shifts in the direction parallel to the substrate surface due to deformation of the pattern surface 3a while the pattern surface 3a is deformed into a convex shape. While the pattern surface 3a is deformed into a convex shape, the imprint apparatus 100 aligns the mold 3 and the substrate 2 in consideration of the shift amount obtained by the obtaining unit. Note that in the first embodiment, the control unit 12 is configured to include the obtaining unit, and has a function of obtaining the shift amount. The present invention, however, is not limited to this. The control unit 12 and the obtaining unit may be separate units.

Figure 6:
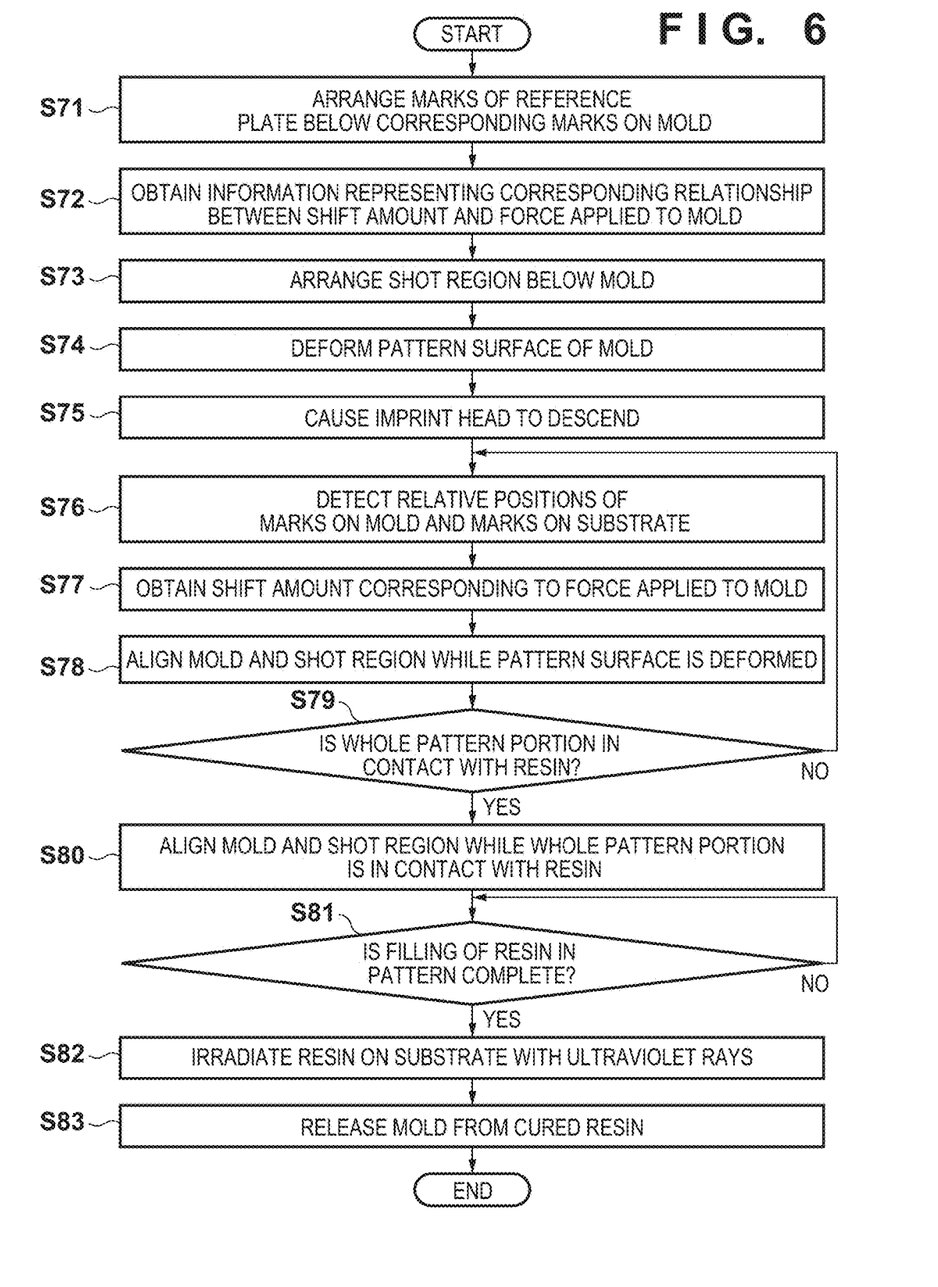
FIG. 6 is a flowchart illustrating imprint processing of the imprint apparatus according to the first embodiment.

Imprint processing of the imprint apparatus 100 according to the first embodiment will be described with reference to FIG. 6. FIG. 6 is a flowchart illustrating imprint processing of the imprint apparatus 100 according to the first embodiment. The imprint processing shown in FIG. 6 is performed by executing a program stored in the storage unit of the control unit 12 shown in FIG. 1. The processing unit of the control unit 12 processes the program stored in the storage unit. The imprint processing of the present invention is executed according to the program stored in the storage unit of the control unit 12. In step S71, the control unit 12 controls the movement of the substrate stage 1 so that marks 9a of a reference plate 9 are arranged below the corresponding marks 7b on the mold, that is, the marks 7b on the mold overlap the corresponding marks 9a of the reference plate 9 from the viewpoint of the detection units 5. At this stage, the pattern surface 3a of the mold 3 is not deformed. For example, the reference plate 9 is arranged on the substrate stage 1 which holds the substrate 2, as shown in FIG. 1. Furthermore, in step S71, the mark 7b on the mold and the mark 9a of the reference plate 9 need to fall within the measurement range (for example, the depth of focus) of each detection unit 5. The control unit 12, therefore, may control the movement of the imprint head 4 or substrate stage 1 in the Z direction to adjust the relative positions in the Z direction of the mold 3 and reference plate 9.

Figure 7:
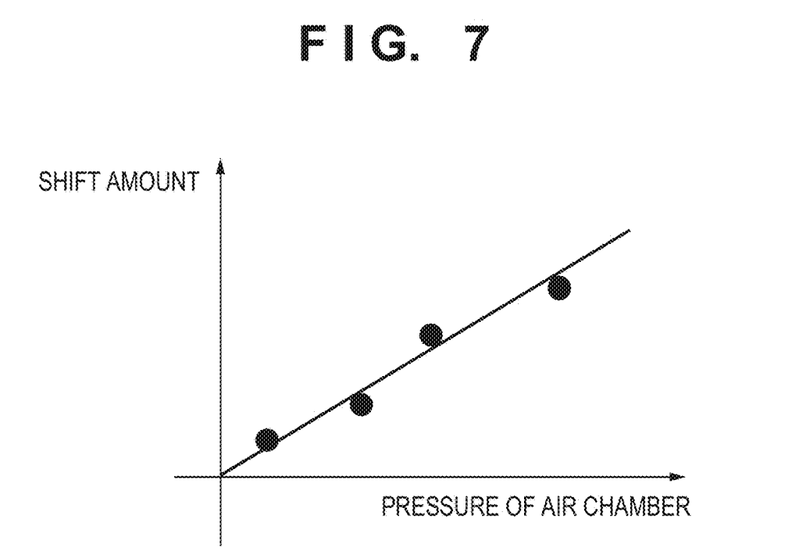
FIG. 7 is a graph showing the corresponding relationship between a shift amount and the pressure of an air chamber.

In step S72, the control unit 12 detects a shift amount using each detection unit 5 while changing the force applied to the mold 3, thereby obtaining information representing the corresponding relationship between the shift amount and the force applied to the mold 3. For example, the control unit 12 controls the deformation unit 11 to change the pressure of the air chamber 13 as the force applied to the mold. This can deform the pattern surface 3a of the mold 3 into a convex shape to bend toward the substrate 2. At this time, the position of the mark 9a of the reference plate 9 is set as a reference position, and the difference between the reference position and the position of a corresponding one of the marks 7b on the mold while the pattern surface 3a is deformed is set as a shift amount. The detection (measurement) process by each detection unit 5 is repeated by changing the pressure of the air chamber 13 and setting the difference between the position of the mark 7b on the mole and that of the mark 9a of the reference plate 9 at this time as a shift amount. This makes it possible to obtain the corresponding relationship between the pressure of the air chamber 13 and the shift amount, as shown in FIG. 7. Referring to FIG. 7, four measurement values are approximated by a linear function, and the approximated linear function is stored in the control unit 12 as information representing the corresponding relationship between the shift amount and the force applied to the mold. Although a plurality of measurement points are approximated by a linear function in FIG. 7, the present invention is not limited to this. Instead of the linear function, a plurality of measurement points may be approximated by a second- or higher-order function or polynomial in accordance with a method of holding the mold 3 or a method of applying a force to the mold 3. FIG. 7 shows the corresponding relationship between the shift amount and the pressure of the air chamber 13, which has been obtained for one of the marks 7b on the mold. Therefore, the corresponding relationship as shown in FIG. 7 can be obtained for each mark 7b on the mold.

The imprint apparatus 100 of the first embodiment uses the reference plate 9 to obtain the difference between the position of the mark 7b on the mold and that of the mark 9a of the reference plate 9 as a shift amount. The present invention, however, is not limited to this. The shift amount may be obtained without using the reference plate 9. For example, the control unit 12 stores, as a reference position, the position of the mark 7b on the mold, which has been detected while the pattern surface 3a of the mold 3 is not deformed. The control unit 12 can then set, as a shift amount, the differences between the reference position stored in the control unit 12 and the position of the mark 7b on the mold, which has been detected while the pattern surface 3a of the mold 3 is deformed. Alternatively, the shift amounts may be obtained using the marks 6 on the substrate. For example, the control unit 12 arranges the marks 7b on the mold below the corresponding marks 6 on the substrate so that the marks 7b on the mold overlap the corresponding marks 6 on the substrate from the viewpoint of the detection units 5 (the marks 7b on the mold coincide with the corresponding marks 6 on the substrate). At this time, out of the plurality of detection units 5, there may exist a detection unit 5 that cannot see that the marks 7b on the mold overlap the corresponding marks 6 on the substrate. In this case, a shape difference has occurred between the pattern portion 3b of the mold 3 and the shot region on the substrate. The shape difference of the pattern surface 3a of the mold 3 may be corrected by applying a force to a side surface of the mold 3 by the above-described actuator 10 so that all the marks 7b on the mold overlap the corresponding marks 6 on the substrate. This makes it possible to overlay all the marks 7b on the mold on the corresponding marks 6 on the substrate while the pattern surface 3a of the mold 3 is not deformed into a convex shape to bend toward the substrate, thereby setting the positions of the marks 6 on the substrate as reference positions. It is then possible to set, as a shift amount, the difference between each reference position and the position of a corresponding one of the marks 7b on the mold, which has been detected while the pattern surface 3a of the mold 3 is deformed.

In step S73, the control unit 12 controls the substrate stage 1 so that the shot region 2a on the substrate to undergo the imprint processing is arranged below the pattern portion 3b of the mold 3. In step S73, since the pattern surface 3a is not deformed into a convex shape, it becomes easy to align the mold and the shot region in the succeeding process by correcting the shape difference between the shot region and the pattern portion 3b of the mold 3 in this process. Therefore, in step S73, the shape difference of the pattern surface 3a of the mold 3 may be corrected so that all the marks on the mold respectively overlap the corresponding marks 6 on the substrate by applying a force to a side surface of the mold by the above-described actuator 10.

In step S74, the control unit 12 controls the deformation unit 11 to apply pressure to the air chamber 13, thereby deforming the pattern surface 3a of the mold 3 into a convex shape. In step S75, the control unit 12 causes the imprint head 4 to descend while the pattern surface 3a of the mold 3 is deformed into a convex shape. That is, the control unit 12 moves the imprint head 4 in the −Z direction to decrease the distance between the mold 3 and the substrate 2. As a method of decreasing the distance between the mold 3 and the substrate 2, the imprint apparatus 100 of the first embodiment moves the imprint head 4 in the −Z direction. The present invention, however, is not limited to this. For example, the substrate stage 1 may be moved in the +Z direction or both the imprint head 4 and the substrate stage 1 may be moved.

In step S76, the control unit 12 controls each detection unit 5 to detect the mark 7b on the mold and the mark 6 on the substrate. In step S77, the control unit 12 obtains a shift amount corresponding to the force applied to the mold 3 from the information, obtained in step S72, representing the corresponding relationship between the shift amount and the force applied to the mold 3. As described above, the information is stored in the control unit 12 as, for example, a linear function. The control unit 12 can obtain the force applied to the mold 3 (the pressure of the air chamber 13) from the deformation unit 11, and calculate a shift amount corresponding to the pressure using the information (linear function) stored in the control unit 12.

In step S78, while the pattern surface is deformed, the control unit 12 aligns the mold 3 and the shot region 2a using the relative positions obtained from the detection results of the detection units 5 in step S76 and the shift amount obtained in step S77. In step S79, the control unit 12 determines whether the whole pattern portion 3b of the mold 3 is in contact with the resin on the substrate, that is, whether deformation of the pattern surface 3a of the mold 3 has become small and the shift amount has become small. If it is determined in step S79 that the pattern portion 3b is not in contact with the resin as a whole, the process returns to step S76 to repeat the process (steps S76 to S78) of aligning the mold 3 and the shot region 2a. This makes it possible to repeat alignment while the pattern surface 3a of the mold 3 is deformed into a convex shape and the pattern portion 3b is not in contact with the resin on the substrate as a whole (only part of the pattern portion 3b is in contact with the resin). As described above, during a time period from when part of the pattern portion 3b comes into contact with the resin on the substrate until the whole pattern portion 3b comes into contact with the resin, that is, while the mold gradually comes into contact with the resin, the pressure of the air chamber 13 is changed and thus the shift amount also changes. In this process, by repeating alignment in step S79, it is possible to perform alignment by sequentially obtaining, from the information, a shift amount corresponding to the force applied to the mold 3. On the other hand, if it is determined in step S79 that the whole pattern portion 3b is in contact with the resin, the process advances to step S80.

In step S80, the control unit 12 aligns the mold 3 and the shot region 2a while the whole pattern portion 3b of the mold 3 is in contact with the resin on the substrate. As described above, while the whole pattern portion 3b of the mold 3 is in contact with the resin on the substrate, it is difficult to change the relative positions of the mold 3 and substrate 2 due to the shearing stress. The imprint apparatus 100 of the first embodiment can align the mold 3 and the shot region 2a while the pattern surface 3a is deformed into a convex shape before the pattern surface 3a of the mold 3 comes into contact with the resin on the substrate. Therefore, while the whole pattern portion 3b of the mold 3 is in contact with the resin on the substrate, the imprint apparatus 100 of the first embodiment need only finely adjust the alignment between the mold 3 and the shot region 2a. That is, it is possible to shorten the time taken to perform alignment while the whole pattern portion 3b of the mold 3 is in contact with the resin on the substrate. It is, therefore, possible to complete alignment between the mold 3 and the shot region before completion of filling of the resin in the pattern of the mold.

In step S81, the control unit 12 determines whether filling of the resin in the pattern 7a of the mold 3 is complete. If filling of the resin in the pattern 7a of the mold 3 is not complete, the control unit 12 stands by (repeats the process in step S81); otherwise, the process advances to step S82. In step S82, the control unit 12 controls the light source 8 to irradiate the resin on the substrate with ultraviolet rays. In step S83, the control unit 12 moves the imprint head 4 in the +Z direction so as to release the mold 3 from the resin, on the substrate, cured by the ultraviolet irradiation. This can transfer the pattern 7a of the mold 3 to the resin on the substrate. Although the imprint apparatus 100 of the first embodiment moves the imprint head 4 in the +Z direction, the present invention is not limited to this. For example, the substrate stage 1 may be moved in the −Z direction, or both the imprint head 4 and the substrate stage 1 may be moved.

As described above, the imprint apparatus 100 of the first embodiment aligns the mold 3 and the substrate in consideration of the shift amount due to deformation of the mold 3 while the pattern surface 3a of the mold 3 is deformed. This makes it possible to accurately perform alignment even before the whole pattern portion 3b of the mold 3 comes into contact with the resin on the substrate. Therefore, while the whole pattern portion 3b of the mold 3 is in contact with the resin on the substrate, it is only necessary to finely adjust the alignment between the mold 3 and the substrate 2. It is, therefore, possible to shorten the time taken to perform alignment while the whole pattern portion 3b of the mold 3 is in contact with the resin on the substrate.

Although the imprint apparatus 100 of the first embodiment detects a shift amount using each detection unit 5 while changing the force applied to the mold 3, and obtains information representing the corresponding relationship between the shift amount and the force applied to the mold 3, the present invention is not limited to this. The imprint apparatus 100 may include, for example, a measurement unit for directly measuring the deformation amount of the pattern surface 3a of the mold 3. The imprint apparatus 100 including such measurement unit measures the deformation amount of the pattern surface 3a using the measurement unit and detects a shift amount using each detection unit 5 while changing the force applied to the mold 3. The imprint apparatus 100 then obtains information indicating the corresponding relationship between the shift amount and the deformation amount of the pattern surface 3a. In this case, in step S77, the control unit 12 can obtain the deformation amount of the pattern surface 3a of the mold 3 from the measurement unit, and calculate a shift amount corresponding to the obtained deformation amount using the information indicating the corresponding relationship between the shift amount and the deformation amount of the pattern surface 3a. As the measurement unit, for example, a gap measurement unit for measuring the distance between the substrate 2 and the pattern surface 3a of the mold 3 using light is usable. The gap measurement unit irradiates the substrate with light emitted from a measurement light source. At this time, the light emitted from the measurement light source is transmitted through the mold to irradiate the substrate. It is possible to measure the distance between the pattern surface 3a and the substrate 2 by using an image sensor to observe interference light obtained by interference with the mold, resin, and substrate.

Although a case in which the alignment marks shift when the mold is deformed into a convex shape has been described in the first embodiment, the present invention is not limited to a case in which the mold is deformed into a convex shape. The substrate may be deformed into a convex shape. The control unit 12 can obtain a shift amount corresponding to the force applied to the substrate 2.

Figure 8:
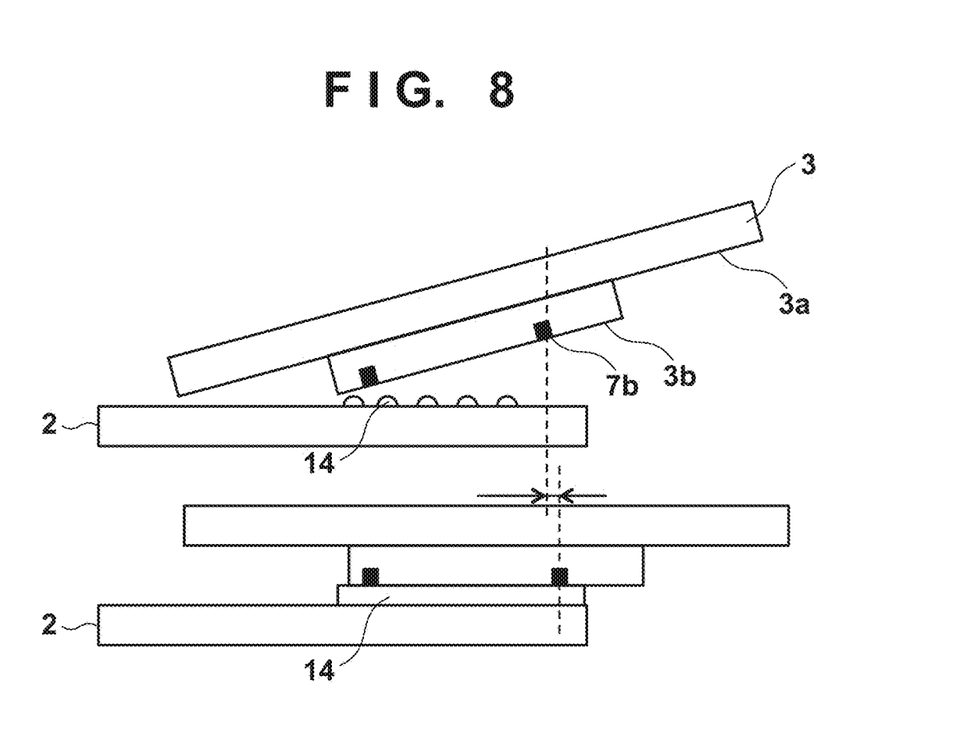
FIG. 8 is a sectional view showing the mold and the substrate when the mold is tilted and brought into contact with the resin on the substrate.

Although a case in which the alignment marks shift when the mold is deformed into a convex shape has been described in the above embodiment, the present invention is not limited to a case in which the mold is deformed into a convex shape. If the pattern surface of the mold and the substrate surface are not parallel to each other, the positions of the marks 7b on the mold shift. As shown in FIG. 8, when the mold 3 is tilted and brought into contact with a resin 14 on the substrate from an edge of the pattern portion 3b, the pattern surface 3a of the mold 3 and the substrate surface are not parallel to each other. Consequently, the positions of the marks shift according to the tilt of the mold. In this case, like the above-described case in which the mold is deformed (bended) into a convex shape, it is possible to accurately perform alignment even when the mold is tilted and brought into contact with the resin 14 on the substrate, by obtaining, in advance, the relationship between the tilt of the mold and the shift amount of the position of each mark.

Embodiment of Method of Manufacturing Article

A method of manufacturing an article according to an embodiment of the present invention is suitable for manufacturing an article, for example, a microdevice such as a semiconductor device or an element having a microstructure. The method of manufacturing an article according to this embodiment includes a step of forming a pattern of a mold on a resin applied on a substrate (a step of performing imprint processing on the substrate) by using the above-described imprint apparatus and imprint method, and a step of processing the substrate on which the pattern is formed in the above step. This manufacturing method further includes other well-known steps (for example, oxidation, film formation, deposition, doping, planarization, etching, resist removal, dicing, bonding, and packaging). When compared to the conventional methods, the method of manufacturing an article according to this embodiment is advantageous in at least one of the performance, quality, productivity, and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions. This application claims the benefit of Japanese Patent Application Nos. 2013-091786 filed on Apr. 24, 2013 and 2014-030788 filed on Feb. 20, 2014, which are hereby incorporated by reference herein in their entirety.

What is claimed is:

1. An imprint method of forming a pattern of an imprint material on a substrate by using a mold having a pattern surface on which a mark is formed, the method comprising:
a deformation step of deforming the pattern surface into a convex shape protruding toward the substrate so that the mold can be gradually brought into contact with the imprint material outward from a central portion of the pattern surface;
an obtaining step of obtaining a shift amount by which the mark on the mold is shifted in a direction along a surface of the substrate by deforming the pattern surface in the deformation step;
a detection step of detecting a relative position between the mark on the mold and a corresponding mark on the substrate in a state where the pattern surface is deformed in the deformation step; and
an alignment step of aligning the mold and the substrate in the direction, in a state where the pattern surface is deformed, based on the relative position detected in the detection step and the shift amount obtained in the obtaining step.

2. The method according to claim 1, further comprising a generation step of generating information representing a relationship between a force to be applied to the mold and an amount by which the mark on the mold is shifted in the direction, the generation step including:
setting, as a reference position, a position of the mark on the mold in a state where the pattern surface is not deformed, and
obtaining, as the amount, a difference between the reference position and the relative position detected a position of the mark on the mold in the direction while changing the first force applied to the mold;
wherein in the obtaining step, the shift amount is obtained based on the information obtained in the generation step.

3. The method according to claim 1, wherein a first force applied to the mold to deform the mold in the deformation step is weakened as the mold gradually comes into contact with the imprint material outward from the central portion of the pattern surface.

4. The method according to claim 1, further comprising a generation step of generating information representing a relationship between a force to be applied to the mold and an amount by which the mark on the mold is shifted in the direction, by measuring the shift amount while changing a first force applied to the mold to deform the pattern surface; and
wherein the obtaining step, the shift amount is obtained based on the information obtained in the generation step.

5. The method according to claim 1, further comprising a generation step of generating information representing a relationship between the shift amount and a deformation amount of the pattern surface; and
wherein in the obtaining step, the shift amount is obtained based on the information obtained in the generation step.

6. The method according to claim 4, wherein in the generation step, a mark on the substrate is positioned so as to coincide with the mark on the mold in the direction in a state where the first force is not applied to the mold, and the information is generated by measuring, as the amount, a difference between a position of the mark on the substrate and a position of the mark on the mold in the direction while changing the first force applied to the mold.

7. The method according to claim 1, wherein the obtaining step, the detection step, and the alignment step are performed before the central portion of the pattern surface comes into contact with the imprint material.

8. The method according to claim 1, wherein the obtaining step, the detection step, and the alignment step are performed during a time period from when the central portion comes into contact with the imprint material until the entire pattern of the mold comes into contact with the imprint material.

9. An imprint method of forming a pattern of an imprint material on a substrate by using a mold having a pattern surface on which a mark is formed, the method comprising:
 a step of arranging the pattern surface and the substrate to not be parallel to each other so that the mold is gradually brought into contact with the imprint material from an edge of the pattern surface;
 a step of obtaining a shift amount indicating how much the mark on the mold in a direction parallel to a substrate surface due to causing the state not parallel with the pattern surface and the substrate;
 a step of detecting the mark on the mold and the mark on the substrate while the pattern surface and the substrate are not parallel to each other, and obtaining relative position of the mold and the substrate from a detection result in a state where the pattern surface is tilted; and
 a step of aligning the mold and the substrate using the shift amount and the relative position while the pattern surface and the substrate are not parallel to each other.

10. A method of manufacturing an article, the method comprising:
 forming a pattern on a substrate using an imprint method; and
 processing the substrate, on which the pattern has been formed, to manufacture the article,
 wherein the imprint method, which is a method of forming a pattern of an imprint material on a substrate by using a mold having a pattern surface on which a mark is formed, the imprint method comprising:
 a deformation step of deforming the pattern surface into a convex shape protruding toward the substrate so that the mold can be gradually brought into contact with the imprint material outward from a central portion of the pattern surface;
 an obtaining step of obtaining a shift amount by which the mark on the mold is shifted in a direction along a surface of the substrate by deforming the pattern surface in the deformation step;
 a detection step of detecting a relative position between the mark on the mold and a corresponding mark on the substrate in a state where the pattern surface is deformed in the deformation step; and
 an alignment step of aligning the mold and the substrate in the direction, in a state where the pattern surface is deformed, based on the relative position detected in the detection step and the shift amount obtained in the obtaining step.

11. A method of manufacturing an article, the method comprising:
 forming a pattern on a substrate using an imprint method; and
 processing the substrate, on which the pattern has been formed, to manufacture the article,
 wherein the imprint method, which is a method of forming a pattern of an imprint material on a substrate by using a mold having a pattern surface on which a mark is formed, the imprint method comprising:
 arranging the pattern surface and the substrate to not be parallel to each other so that the mold is gradually brought into contact with the imprint material from an edge of the pattern surface;
 obtaining a shift amount indicating how much the mark on the mold shifts in a direction along a surface of the substrate due to causing the state not parallel with the pattern surface and the substrate;
 detecting the mark on the mold and the mark on the substrate while the pattern surface and the substrate are not parallel to each other, and obtaining relative position of the mold and the substrate from a detection result in a state where the pattern surface is tilted; and
 aligning the mold and the substrate in the direction, in a state where the pattern surface and the substrate are not parallel to each other, based on the relative position obtained in the detecting and the shift amount obtained in the obtaining.

12. The method according to claim 1, further comprising a second alignment step of aligning the mold and the substrate in the direction without using the shift amount, in a state where an entirety of a pattern formed on the pattern surface of the mold is brought into contact with the imprint material, based on the relative position detected in the detection step.

\* \* \* \* \*